(12) United States Patent
Van Hout et al.

(10) Patent No.: US 7,599,811 B2
(45) Date of Patent: Oct. 6, 2009

(54) SENSOR FOR LITHOGRAPHIC APPARATUS AND METHOD OF OBTAINING MEASUREMENTS OF LITHOGRAPHIC APPARATUS

(75) Inventors: Frits Jurgen Van Hout, Retie (BE); Josephus Antonius Maria Van Bommel, Sint Michielsgestel (NL); Peter Dirksen, Valkenswaard (NL); Mark Kroon, Utrecht (NL); Casparus Anthonius Henricus Juffermans, Valkenswaard (NL); Renatus Maria Adrianus Mathias Van Den Eijnden, Eindhoven (NL)

(73) Assignees: ASML Netherlands B.V., Veldhoven (NL); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/582,247

(22) PCT Filed: Dec. 9, 2004

(86) PCT No.: PCT/NL2004/000855

§ 371 (c)(1),
(2), (4) Date: Jun. 12, 2007

(87) PCT Pub. No.: WO2005/057290

PCT Pub. Date: Jun. 23, 2005

(65) Prior Publication Data

US 2007/0273869 A1    Nov. 29, 2007

Related U.S. Application Data

(60) Provisional application No. 60/608,938, filed on Dec. 9, 2003.

(51) Int. Cl.
*G06F 15/00* (2006.01)

(52) U.S. Cl. .......................................... 702/127; 438/5
(58) Field of Classification Search ................. 702/127, 702/116, 117, 118, 132, 136, 184–185, 188; 438/5, 10, 11, 14, 17, 18, 400
See application file for complete search history.

(56) References Cited

U.S. PATENT DOCUMENTS

| 5,345,557 A * | 9/1994 | Wendt ........................ 710/100 |
| 6,826,607 B1 * | 11/2004 | Gelvin et al. ................ 709/224 |
| 2003/0069051 A1 | 4/2003 | Pretre et al. ................. 455/572 |
| 2005/0117148 A1 | 6/2005 | Dirksen et al. | |

FOREIGN PATENT DOCUMENTS

| WO | 00/16253 | 3/2000 |
| WO | 03/056392 A1 | 7/2003 |

\* cited by examiner

OTHER PUBLICATIONS

International Search Report issued in PCT/NL2004/000855.

*Primary Examiner*—Edward Raymond
(74) *Attorney, Agent, or Firm*—Pillsbury Winthrop Shaw Pittman LLP (57) ABSTRACT

A sensor arrangement may be used to measure properties, such as optical properties, of a device arranged to process substrates. The sensor arrangement includes a substrate having the following: a plurality of sensor elements provided as an integrated circuit in the substrate, for each one of the plurality of sensor elements associated electronic circuitry comprising a processing circuit connected to the sensor element and an input/output interface connected to the processing circuit, and a power supply unit configured to supply operating power only to the electronic circuitry associated with one or more of the plurality of sensor elements which are in use. The at least one sensor element and possibly the processing electronics, the input/output unit, and/or the power supply unit may be provided as one or more integrated circuits or other structures in the substrate.

34 Claims, 2 Drawing Sheets

SENSOR FOR LITHOGRAPHIC APPARATUS AND METHOD OF OBTAINING MEASUREMENTS OF LITHOGRAPHIC APPARATUS

This application is a National Stage of International Publication No. WO 2005/057290, filed Dec. 9, 2004, and claims priority to U.S. Ser. No. 60/608,938, filed Dec. 9, 2003, both of which being herein incorporated by reference in their entirety.

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and No. 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

A lithographic apparatus may include a support structure that supports (i.e. bears the weight of) the patterning structure. The support structure may hold the patterning structure in a particular fashion that depends on such factors as the orientation of the patterning structure, the design of the lithographic apparatus, and other conditions such as, for example, whether or not the patterning means is held in a vacuum environment. The support may include mechanical clamping, vacuum, or other clamping techniques (for example, electrostatic clamping, possibly under vacuum conditions). The support structure may be a frame or a table, for example, which may be fixed or movable as required and which may ensure that the patterning means is at a desired position, for example with respect to the projection system.

Any use of the terms "reticle" or "mask" herein may be considered synonymous with the more general term "patterning structure." For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction)

while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-0672504.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, and catadioptric systems, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation or illumination system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion", respectively.

The optical properties of the optical components of a lithographic apparatus may vary during operation. To maintain a predetermined level of quality, it may be important to know whether any anomalies in the optical system of the lithographic apparatus are present. The optical properties can be tested using special-purpose test equipment, e.g. as described in U.S. Published Patent Application No. US2002/0001088A. This publication describes an apparatus for wave front detection, which may be used e.g. to measure and correct aberration in the optical components of a stepper or scanner for microlithography.

These known test devices are positioned in the position of a wafer being exposed, requiring disassembly of the lithography apparatus to a large extent. As a consequence, the apparatus to be tested may have to be taken out of operation for a considerable amount of time.

SUMMARY

A sensor arrangement according to one embodiment of the invention comprises a substrate having the following: a plurality of sensor elements provided as an integrated circuit in the substrate, wherein for each one of the plurality of sensor elements associated electronic circuitry is provided comprising a processing circuit connected to the sensor element, and an input/output interface connected to the processing circuit A power supply unit is provided which is configured to supply operating power only to the electronic circuitry associated with one or more of the plurality of sensor elements which are in use. Apparatus including such arrangements, and methods of using such arrangements, are also disclosed.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, a sensor arrangement that may be used to allow testing of the optical components of an apparatus without requiring a major effort to prepare and perform the testing. Such a sensor arrangement may be used to measure properties, such as optical properties, of a device arranged to process substrates (such as a lithographic apparatus).

Figure 1:
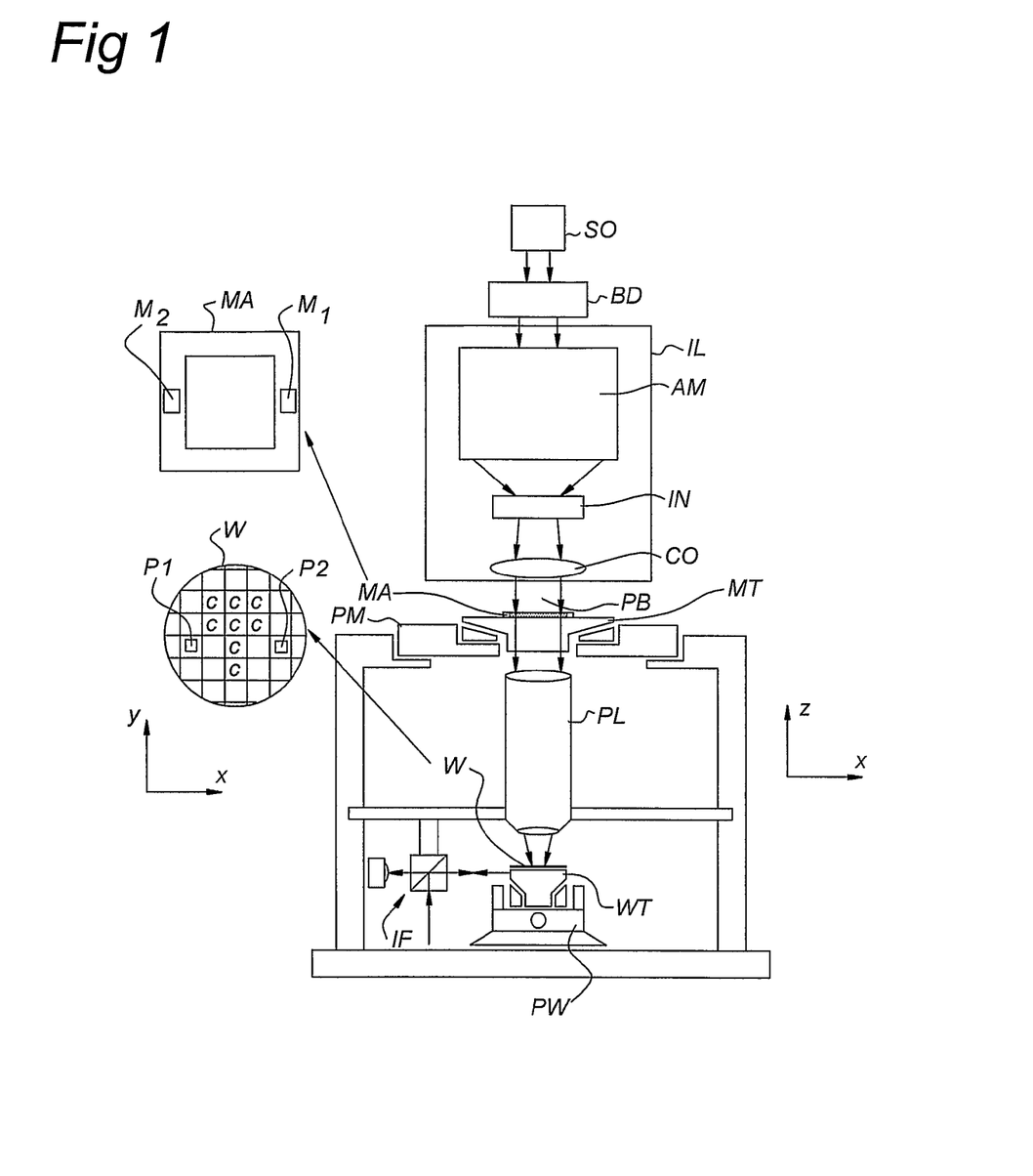
FIG. 1 depicts a lithographic apparatus in conjunction with which an embodiment of the current invention can be employed.

FIG. 1 schematically depicts a lithographic projection apparatus in conjunction with which an embodiment of the current invention can be employed. The apparatus comprises:

A radiation system configured to supply (e.g. having structure capable of supplying) a projection beam of radiation. In this particular example, the radiation system for supplying a projection beam PB of radiation (e.g. UV or EUV radiation) comprises a radiation source SO and an illuminator IL;

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask), However, in general, it may also be of a reflective type, for example (e.g. with a reflective mask). Alternatively, the apparatus may employ another kind of patterning structure, such as a programmable mirror array of a type as referred to above.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of a beam delivery system BD comprising, for example, suitable direction mirrors and/or a beam expander); this latter scenario is often the case when the source LA is an excimer laser. The current invention and claims encompass both of these scenarios. The source SO and the illuminator IL, together with the beam delivery system BD if any, may be referred to as a radiation system.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure PW (and interferometric measuring structure IF), the substrate table WT can be moved accurately, e.g. so as to position different target portions C in the path of the beam PB. Similarly, the first positioning structure PM (possibly in conjunction with another position sensor, not explicitly shown) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB. In step mode, the maximum size of the exposure field may limit the size of a target portion C imaged in a single static exposure;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). The velocity and direction of the substrate table WT relative to the mask table MT may determined by the magnification (or demagnification) and image reversal characteristics of the projection system PL. In this manner, a relatively large target portion C can be exposed, without having to compromise on resolution. In scan mode, the maximum size of the exposure field may limit the width (in the non-scanning direction) of the target portion in a single dynamic exposure, whereas the length of the scanning motion may determine the height (in the scanning direction) of the target portion;

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above-described modes of use or entirely different modes of use may also be employed.

The optical system of the lithographic apparatus may be very important for the final quality of products produced by the lithographic apparatus. Therefore, it may be important to measure the characteristics of the optical system, and possibly to adjust one or more elements of the optical system (such as the projection lens PL), from time to time. In the conventional manner, such measurement may be performed by partial disassembly of the lithographic apparatus and installation of special test equipment in place of the wafer W (or wafer stage W1).

Figure 2:
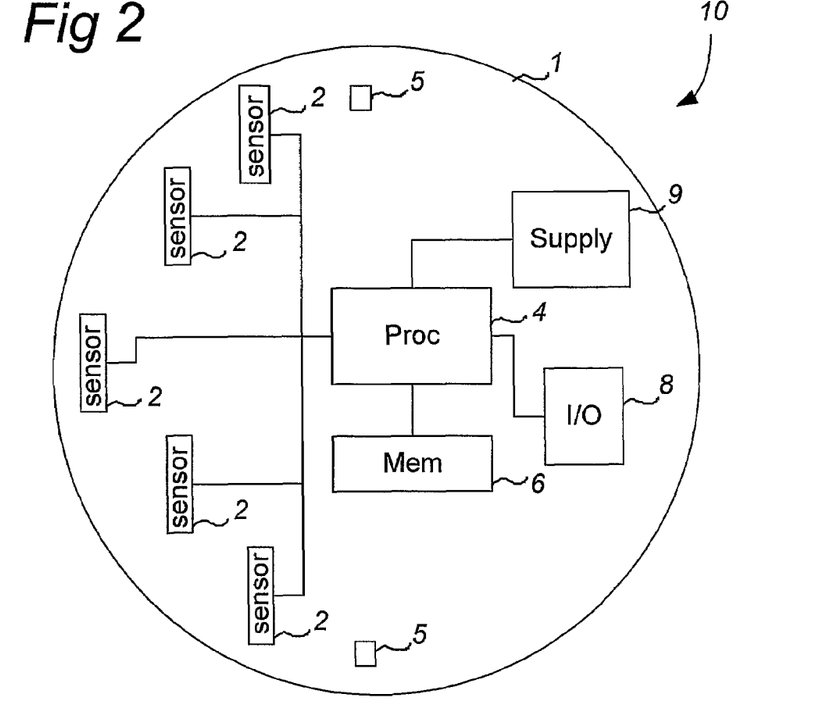
FIG. 2 depicts a sensor arrangement according to an embodiment of the invention.

In FIG. 2, a top view is shown of a sensor arrangement 10. The sensor arrangement 10 comprises a semiconductor wafer 1, on which a number of elements are formed as integrated circuits on the wafer 1. The wafer 1 may be of a silicon material, or another material or material composition suitable for wafer processing.

The sensor arrangement comprises a number of sensors 2 (or "sensor arrays" or "sensor elements"), processing electronics (e.g. a processing circuit, such as an array of logic elements configured to execute a series of operations) 4 receiving the output signals of the sensors 2, and a memory 6 connected to the processing circuit 4. The memory 6 may comprise a non-volatile part for storing operational instructions for the processing circuit 4, and a volatile or non-volatile part for storing measurement data. Furthermore, an input/output unit (e.g. an interface circuit) 8 is present which is connected to the processing circuit 4, and a power supply unit 9. The input/output unit 8 can transfer data from the sensor arrangement 10 to an external device, and the power supply unit 9 provides operating power to the elements on the sensor arrangement 10.

Furthermore, the wafer 1 may comprise alignment marks 5, which may be comparable to alignment marks in normal wafers W to be processed and may be used to align the wafer 1 in the lithographic apparatus.

In an alternative form, it is possible to have a number of separate sensor arrangements 10 integrated on the wafer (i.e. a combination of sensors 2 with one or more of processing electronics 4, memory 6, I/O unit 8 and power supply unit 9). Each of the sensor arrangements 10 may then be arranged to measure a specific characteristic of the lithographic apparatus (see below).

It is noted that international patent publication WO03/056392 describes such a sensor arrangement. According to an embodiment of the present invention, the power supply unit 9 is configured to supply operating power only to the electronic circuitry 4, 6, 8 associated with one or more of the plurality of sensor elements 2 which are in use.

In at least some implementations, the sensor arrangement 10 can be used to measure optical properties of the lithographic apparatus without the necessity to disassemble the lithographic apparatus. For example, the sensor arrangement 10 may be configured to be transportable inside the lithographic apparatus as a normal wafer W.

The sensors 2 can be of various types and/or measurement principles. For calibration and optimization purposes, it may be desirable to evaluate the spatial image as formed by the illuminating system IL and projection lens PL frequently. For such an application, the sensors 2 can be arranged to monitor the spatial intensity distribution at the wafer position in three dimensions. The sensors 2 can also be used to measure the position of special marks which are scarcely present on production masks MA and abundantly present on special purpose masks MA. Also, the sensors 2 can be arranged to measure the shape of the point-spread function when imaging small mask features. Such information can be processed to obtain detailed information on the lithographic apparatus, such as lens and condenser aberrations.

In a specific example, the sensors 2 comprise diode arrays integrally formed as integrated circuits in the wafer 1. It may be desirable to characterize the diode arrays (initially and/or periodically), e.g. in order to account for factors that may include differences in response among the array elements, changes in response over time, device aging and/or contamination, etc.

Alternatively, the light intensity over the field (e.g. illumination uniformity at wafer level) can also be measured (e.g. to provide a spot sensor functionality). Also, stray light effects can be measured.

The sensors 2 may be connected to processing electronics 4. In the embodiment shown, all sensors 2 on the wafer 1 are connected to a single integrated circuit for processing of the sensor signals. Alternatively, part of the processing electronics 4 may be located directly adjacent to the sensor 2 on the wafer. The processing electronics 4 may perform signal preprocessing (such as integration and digitization), but can also perform more complex computations, e.g. based on the signals of more than one (possibly all) sensors 2 on the wafer 1.

Connections to external devices for further processing of the sensor arrangement signal and for power supply of the sensor arrangement 10 can be made by physical connections, e.g. using a special type of removable connector on the wafer stage WT. However, such a solution may be very cumbersome and could require additional equipment inside the lithographic apparatus. Therefore, in an alternative embodiment, the sensor arrangement 10 on the wafer 1 is provided in combination with a chuck, the chuck being the part of the wafer stage WT on which the wafer is held. The combination of sensor arrangement 10 and chuck can be positioned temporarily as a replacement chuck in the wafer stage WT during measurement. The combination of chuck and sensor arrangement 10 can be a portable unit, which can be connected to the internal Ethernet or other data network of the lithography apparatus, allowing it to be controlled by the lithographic apparatus software. The replacement chuck may provide all, or only a part (e.g. positioning in fewer than six degrees of freedom), of the functionality of the chuck which it replaces.

However, this first alternative may still require temporary removal of certain parts of the lithography apparatus. Therefore, in a further alternative embodiment, both the I/O unit 8 and the power supply unit 9 operate in a wireless manner, which is known as such from the disclosure in WO03/056392.

The operating power necessary to operate the sensor arrangement 10 may be supplied using e.g. RF power. In such a case, the power supply unit 9 may comprise an antenna (which may be attached to or integrated in the wafer 1) and a circuit to convert the received RF power into DC or AC power as required. In an embodiment according to the present invention, the power supply unit 9 is arranged to receive RF power at different frequencies. Depending on the frequency, a specific part of sensor arrangement 10 (or a specific sensor arrangement 10 when multiple sensor arrangements 10 are present on a wafer 1) is supplied with operating power.

Also, the I/O unit 8 may operate using RF signal exchange. In this case, the I/O unit 8 may comprise an antenna attached to or integrated in the wafer 1 (which may be separate from or the same as an antenna of the power supply unit 9, if provided). The processing electronics 4 may be arranged to cooperate with the I/O unit 8 to allow data exchange to an external device. E.g., the external device can request a predetermined set of data stored in the memory 6, and/or the external device can upload amended operating instructions for the processing electronics 4 to be stored in the memory 6. When multiple sensor arrangements 10 are present on the wafer 1, a multiplexing technique (e.g. frequency-division multiplexing) may be used to address a specific one of the I/O units 8.

It is conceivable that other wireless techniques may be used by the I/O unit 8 and/or power supply unit 9, e.g. using light. Light (electromagnetic radiation) can be used to transfer energy or data. It is conceivable, for example, to integrate solar cells or other photo-voltaic cells in the wafer 1 to provide power. Various addressing techniques, known as such, may be used.

External elements for supplying power to and/or for providing interfacing with the sensor arrangement 10 may be positioned, for example, inside the lithographic apparatus (e.g. close to a wafer table WT, one example of which is shown in FIG. 1). For example, the test arrangement 10 may be connected to a data network of the lithographic apparatus. Such a connection may allow fully automatic testing and adjustment of the optical system of the lithographic apparatus. Alternatively, these elements may be provided outside of the lithographic apparatus. A potential advantage of the latter arrangement is that a portable test set may be composed, comprising a wafer 1 with the sensor arrangement 10 and external equipment for providing power and data exchange. Without a need to add further equipment to the lithographic apparatus, such a set may thus save cost.

As an alternative, it is possible to store the measurement data (raw data or processed data) in the wafer memory 6, and retrieve this data off-line, i.e. outside of the lithographic apparatus.

Figure 3:
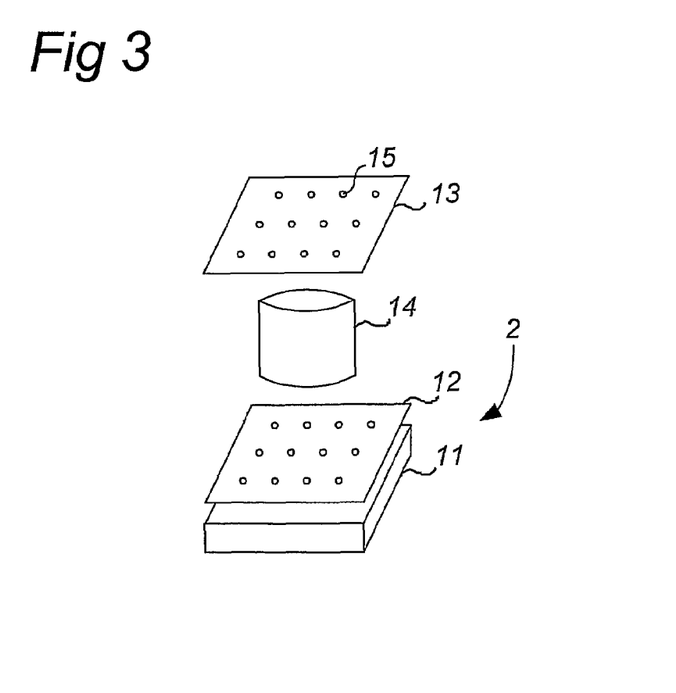
FIG. 3 depicts a simplified view of a dedicated test mask in combination with a sensor arrangement according to an embodiment of the invention.

In FIG. 3, an example is shown of a possible test scenario, which is known as such from WO03/056392. It is noted that the sensor 2 as described below may also be used as such in a different sensor arrangement. To test optical properties of e.g. a projection lens system PL of a lithographic apparatus, the sensor arrangement 10 is positioned at the normal wafer position. A suitable test mask is positioned on the mask table MT. In FIG. 3, this is shown in a simplified view, in which the test mask is denoted by reference numeral 13, and the projection lens system PL by reference numeral 14. The sensor 2 comprises a photodiode 11 and a detector mask 12, which may both be integrated in the wafer 1.

Both the test mask 13 and the detector mask 12 comprise N×N regularly spaced transparent holes 15, which each have a diameter that is small compared to $\lambda/NA$ ($\lambda$ being the wavelength of the projected light, and NA being the numerical aperture of the projection lens 14). The pitch of the holes 15 is large compared to the resolution of the projection lens 14. In this arrangement, essentially the point-spread function of the lens can be observed by the sensor 2, with the intensity increased by a factor which is equal to the number of holes $N^2$. The wafer 1 can be scanned in three dimensions, thus allowing recording the aerial image or point-spread function. A mathematical procedure to determine distortion, focal plane and other high-order lens aberrations from the observed point spread function is known. The described approach has the advantage that the measurement conditions can be made to correspond to the normal exposure conditions of a wafer W being processed in the lithographic apparatus.

The combination of test mask 13 and sensor 2 can also be provided with other optical features, in order to be able to measure various types of aberrations. The array of $\delta$-type of objects (holes 15) is suitable for measuring the projection lens aberration. A Fresnel zone lens as test mask 13 allows detecting condenser lens aberrations. Large squares on the test mask 13 allow measurement of stray light characteristics. Regular device patterns (normal production masks MA) allow measurement of pattern fidelity and to optimize illumination conditions. A brick wall structure on the test mask 13 allows measuring other aberrations.

The sensor 2 described with reference to FIG. 3 can be used as a single sensor 2 in a sensor arrangement 10 according to an embodiment of the present invention. However, it is also possible to combine a number of these sensors in a sensor array. Also, sensors or sensor arrays 2 can be provided spread out on the surface of the wafer 1, possibly to allow probing of the entire image field of the lithographic apparatus in a single step. Such an arrangement may be used to quickly perform uniformity measurements across the entire image field. Also, it is possible to provide sensors 2 in combination with patterns on the test mask 13 as described above, for example to allow measurement and detection of various types of aberrations in a single-step test.

In a further embodiment, the sensor arrangement 10 is provided on a substrate 1 with a different form, allowing it to be positioned at the position of the mask MA in the mask table MT. Such an arrangement may be used to allow specific measurements of the optical system of the lithographic apparatus up to the mask table MT (e.g. an illumination system IL as described above with reference to FIG. 1).

The invention has been explained using an exemplary embodiment specifically directed at a refractive optics lithographic apparatus. However, the invention can also be used in other types of lithographic apparatus, such as reflective optics lithographic apparatus. Furthermore, the present invention can be used in all types of lithographic apparatus, such as deep UV, 193 nm, 157 nm or EUV types.

A sensor arrangement according to an embodiment of the invention comprises a substrate, said sensor arrangement having a plurality of sensor elements provided as an integrated circuit in the substrate. For each one of the plurality of sensor elements associated electronic circuitry is provided, comprising a processing circuit connected to the sensor element and an input/output interface connected to the processing circuit. Furthermore, the sensor arrangement comprises a power supply unit configured to supply operating power only to the electronic circuitry associated with one or more of the plurality of sensor elements which are in use.

By having a decentralized configuration of electronic circuitry associated with a sensor element (or a group of sensor elements), reduces the complexity of the electronic circuitry.

It is no longer necessary to provide very complex processing electronics on the wafer which operates on signals from all sensor elements of the sensor arrangement, but only dedicated electronic circuitry for single sensor elements or small groups of sensor elements, which are irradiated for the specific test.

In a further arrangement the plurality of sensor elements is distributed over the substrate in a predetermined manner, e.g. concentrated around the wafer center. By having the sensor elements located near the center of the wafer 1, and thus near the center of the wafer stage, requires a much smaller stage stroke, thus allowing the lithographic apparatus to operate more efficiently.

The electronic circuitry associated with each one of the plurality of sensor elements is distributed over the substrate in a predetermined manner in a further embodiment, e.g. distributed evenly over the entire substrate surface. Thus may allow a less complex lay-out of the electronic circuitry and the sensor elements, and thus a more simple manufacture of the sensor arrangement. Also, it is possible to control heating effects caused by the electronic circuitry by proper lay-out of the electronic circuitry.

In a further embodiment, also the processing electronics, the input/output unit and/or the power supply unit are provided as integrated circuits or other structures in the substrate or attached thereto (e.g. on or above the surface). This provides a sensor arrangement which can be handled as a usual substrate or wafer. Also, multiple sensor arrangements can be integrated on a single wafer. Using such an embodiment, a single test wafer may be provided which can be used to measure various optical properties of the device, using a specific one of the multiple sensor arrangements. Also, measurements can be executed involving the complete substrate surface, which allows single-step uniformity measurements.

The processing electronics are in a further embodiment connected to a memory (e.g. volatile and/or non-volatile) configured to store software code and/or data. The software code is used to program the processing electronics and can be changed to make the sensor arrangement suited for specific types of measurements.

In a further embodiment, the input/output unit is arranged to exchange data with an external device using wireless communication techniques. The wireless communication technique may be based on RF techniques or using light communication. This allows the sensor arrangement to be used as a stand-alone unit, which can be handled by the device like a normal substrate to be processed.

In a further embodiment, the sensor arrangement further comprises a chuck on which the sensor arrangement is mounted, the chuck being mountable to the wafer stage of a lithographic apparatus. The chuck may comprise interface means for connecting the sensor arrangement to a data network in the lithographic apparatus. With such an embodiment, it may be possible to use the sensor arrangement as a portable unit and to bring it to a device to be tested, such that only a small part has to be installed in the lithographic apparatus to perform the measurements.

A sensor arrangement according to an embodiment of the invention comprises a substrate, e.g. a semiconductor substrate such as a silicon substrate, in which the substrate comprises at least one sensor element, processing electronics connected to the at least one sensor element, an input/output unit connected to the processing electronics, and a power supply unit for supplying operating power to the sensor arrangement, in which the at least one sensor element is provided as an integrated circuit in the substrate, wherein the power supply unit is arranged to convert a wireless signal having a predetermined frequency into a supply voltage for a predetermined part of the sensor arrangement. The predetermined part may e.g. be a combination of one or more sensor elements, processing electronics and memory on a specific part of the substrate or having a specific type of test arrangement. In this manner, the power is only delivered and consumed in that part, which may result in less power consumption and/or less formation of hot spots in the substrate. Also, the power supply unit may be arranged to convert wireless energy into a supply voltage for the sensor arrangement, such as a transponder type of converter.

Such a sensor arrangement can be used in the device as a normal substrate to be processed. Therefore, measurement and characterization of the optical properties can be executed without further disassembly and assembly work on the device. As the at least one sensor element is integrated in the substrate, the optical properties of the device are measured at the right position. The at least one sensor element can be a photo-sensitive semiconductor element, such as a photo cell, photo diode, photo transistor or even a photo-voltaic cell.

A lithographic apparatus according to one embodiment of the invention includes an illumination system for providing a beam of radiation; a support structure for supporting patterning structure, the patterning structure serving to impart the beam with a pattern in its cross-section; a substrate table for holding a substrate; a projection system for projecting the patterned beam onto a target portion of the substrate; and a sensor arrangement as described herein, in which the at least one sensor element and processing electronics are arranged to measure the aberration of one or more of the optical systems of the lithographic apparatus.

The sensor arrangement may be used to test and measure the optical properties of the lithographic apparatus, such as the illumination system and the projection system. These systems may use both refractive and reflective optics. Specific combinations of sensor elements and test patterning means or test masks may be used to test specific types of optical properties.

A method for measuring properties, such as optical properties, of a device arranged to process substrates, includes entering a sensor arrangement as described herein and positioning the sensor arrangement in a measurement position; executing measurements using the sensor arrangement; and removing the sensor arrangement from the device.

Using an embodiment of the present sensor arrangement, in which all sensor arrangement elements are integrated in a single substrate, it is possible to have the sensor arrangement transported through the device, such as a lithographic apparatus, just as a normal substrate to be processed. Such an arrangement ma allows quick and more frequent testing of the (e.g. optical) properties of the device, without the necessity to disassemble and/or stop operating the device.

Whilst specific embodiments of the invention have been described above, it will be appreciated that the invention as claimed may be practiced otherwise than as described. It is explicitly noted that the description of these embodiments is not intended to limit the invention as claimed.

The invention claimed is:

1. A sensor arrangement comprising:
   a substrate;
   a plurality of sensor elements, each sensor provided as an integrated circuit in the substrate;
   electronic circuitry comprising:
   i) a processing circuit arranged on the substrate and connected to at least one of the sensor elements, the processing circuit being configured to process a signal generated by the at least one of the sensor elements;

ii) an input/output interface arranged on the substrate and connected to the processing circuit; and a power supply unit arranged on the substrate and configured to supply operating power only to electronic circuitry associated with sensor elements which are in use.

2. The sensor arrangement according to claim 1, in which the plurality of sensor elements is distributed over the substrate in a predetermined manner.

3. The sensor arrangement according to claim 1, in which electronic circuitry associated with each one of the plurality of sensor elements is distributed over the substrate in a predetermined manner.

4. The sensor arrangement according to claim 1, wherein the sensor is an optical sensor.

5. The sensor arrangement according to claim 1, wherein the substrate is configured to fit into a wafer chuck of a lithographic apparatus.

6. The sensor arrangement according to claim 1, wherein at least one of the processing circuit, the input/output interface, and the power supply unit is provided as an integrated circuit in the substrate.

7. The sensor arrangement according to claim 1, wherein the processing circuit is connected to a memory configured to store at least one among software code and data.

8. The sensor arrangement according to claim 1, wherein the input/output interface is arranged to exchange data with an external device using a wireless communication technique.

9. The sensor arrangement according to claim 1, wherein the sensor arrangement further comprises a chuck on which the sensor arrangement is disposed, the chuck being mountable to a wafer stage of a lithographic apparatus.

10. The sensor arrangement according to claim 9, wherein the chuck comprises an interface configured to connect the sensor arrangement to a data network of the lithographic apparatus.

11. A sensor arrangement comprising:
a substrate; and
a plurality of components comprising:
i) at least one sensor element provided as an integrated circuit in the substrate;
ii) a processing circuit connected to the at least one sensor element;
iii) an input/output interface connected to the processing circuit; and
iv) a power supply unit said power supply unit configured to supply operating power to at least one other component of the sensor arrangement, wherein the power supply unit is arranged to convert a wireless signal having a first predetermined frequency into a supply voltage for a first part of the sensor arrangement and to convert wireless energy having a second predetermined frequency into a supply voltage for a second part of the sensor arrangement different from the first part.

12. A lithographic apparatus comprising:
a substrate; and
one or more sensor arrangements, each sensor arrangement having:
i) a plurality of sensor elements, each sensor element provided as an integrated circuit in the substrate and associated with electronic circuitry that comprises:
a) a processing circuit arranged on the substrate and connected to at least one of the sensor elements, the processing circuit being configured to process a signal generated by the at least one of the sensor elements; and b) an input/output interface arranged on the substrate and connected to the processing circuit; and
ii) a power supply unit arranged on the substrate and configured to supply operating power only to electronic circuitry associated with one or more of the plurality of sensor elements which are in use.

13. The lithographic apparatus according to claim 12, in which the plurality of sensor elements is distributed over the substrate in a predetermined manner.

14. The lithographic apparatus according to claim 12, in which the electronic circuitry associated with each one of the plurality of sensor elements is distributed over the substrate in a predetermined manner.

15. The lithographic apparatus according to claim 12, wherein the substrate is configured to fit into a wafer chuck of the lithographic apparatus.

16. The lithographic apparatus according to claim 12, wherein at least one of the processing circuit, the input/output interface, and the power supply unit is provided as an integrated circuit in the substrate.

17. The lithographic apparatus according to claim 12, wherein the processing circuit is connected to a memory configured to store at least one among software code and data.

18. The lithographic apparatus according to claim 12, wherein the input/output interface is arranged to exchange data with an external device using a wireless communication technique.

19. The lithographic apparatus according to claim 12, wherein the lithographic apparatus further comprises a chuck disposed on a wafer stage of the lithographic apparatus and on which the sensor arrangement is disposed.

20. The lithographic apparatus according to claim 19, wherein the chuck comprises an interface configured to connect the sensor arrangement to a data network of the lithographic apparatus.

21. A lithographic apparatus comprising:
a sensor arrangement comprising:
a substrate; and
a plurality of components comprising:
at least one sensor element provided as an integrated circuit in the substrate;
a processing circuit connected to the at least one sensor element;
an input/output interface connected to the processing circuit; and
a power supply unit configured to supply operating power to at least one other component of the sensor arrangement, wherein the power supply unit is arranged to convert a wireless signal having a first predetermined frequency into a supply voltage for a first part of the sensor arrangement and to convert wireless energy having a second predetermined frequency into a supply voltage for a second part of the sensor arrangement different from the first part, and
a projection system configured to project a patterned beam of radiation onto a target portion of the substrate, wherein the sensor arrangement is arranged to measure an aberration of the projection system.

22. A method for measuring optical properties of a device arranged to process substrates, comprising:
introducing a sensor arrangement in the device and positioning the sensor arrangement in a measurement position;

executing measurements using the sensor arrangement; and removing the sensor arrangement from the device, wherein the sensor arrangement comprises:
i) a substrate;
ii) a plurality of sensor elements, each sensor element provided as an integrated circuit in the substrate and associated with electronic circuitry comprising that comprises:
   a) a processing circuit arranged on the substrate and connected to at least one of the sensor elements, the processing circuit being configured to process a signal generated by the at least one of the sensor elements; and
   b) an input/output interface arranged on the substrate and connected to the processing circuit; and
ii) a power supply unit arranged on the substrate and configured to supply operating power only to electronic circuitry associated with one or more of the plurality of sensor elements which are in use.

23. The method according to claim 22, wherein the substrate is configured to fit into a wafer chuck of the device.

24. A method for measuring properties, of a device arranged to process substrates, comprising:

introducing a sensor arrangement into the device and positioning the sensor arrangement in a measurement position;

executing measurements using the sensor arrangement; and removing the sensor arrangement from the device, wherein the sensor arrangement comprises:
a substrate; and
at least one sensor element provided as an integrated circuit in the substrate;
a processing circuit connected to the at least one sensor element;
an input/output interface connected to the processing circuit; and
a power supply unit configured to supply operating power to at least one other component of the sensor arrangement, wherein the power supply unit is arranged to convert a wireless signal having a first predetermined frequency into a supply voltage for a first part of the sensor arrangement and to convert wireless energy having a second predetermined frequency into a supply voltage for a second part of the sensor arrangement different from the first part.

25. A sensor arrangement comprising:
a substrate;
a plurality of sensor elements, each sensor element provided as an integrated circuit in the substrate; and
electronic circuitry comprising:
   i) a processing circuit arranged on the substrate and connected to at least one of the sensor elements, the processing circuit being configured to process a signal generated by the at least one of the sensor elements;
   ii) an input/output interface arranged on the substrate and connected to the processing circuit; and
   iii) a power supply unit arranged on the substrate and configured to supply operating power to a processing circuit associated with one or more of the plurality of sensor elements which are in use.

26. The sensor arrangement according to claim 25, in which the plurality of sensor elements are distributed over the substrate in a predetermined manner.

27. The sensor arrangement according to claim 25, in which electronic circuitry associated with each one of the plurality of sensor elements is distributed over the substrate in a predetermined manner.

28. The sensor arrangement according to claim 25, wherein the sensor element is an optical sensor.

29. The sensor arrangement according to claim 25, wherein the substrate is configured to fit into a wafer chuck of a lithographic apparatus.

30. The sensor arrangement according to claim 25, wherein at least one of the processing circuit, the input/output interface, and the power supply unit is provided as an integrated circuit in the substrate.

31. The sensor arrangement according to claim 25, wherein the processing circuit is connected to a memory configured to store at least one among software code and data.

32. The sensor arrangement according to claim 25, wherein the input/output interface is arranged to exchange data with an external device using a wireless communication technique.

33. The sensor arrangement according to claim 25, wherein the sensor arrangement further comprises a chuck on which the sensor arrangement is disposed, the chuck being mountable to a wafer stage of a lithographic apparatus.

34. The sensor arrangement according to claim 33, wherein the chuck comprises an interface configured to connect the sensor arrangement to a data network of the lithographic apparatus.

* * * * *